United States Patent
Wu et al.

(10) Patent No.: US 11,683,926 B2
(45) Date of Patent: Jun. 20, 2023

(54) METHOD OF MANUFACTURING SEMICONDUCTOR STRUCTURE

(71) Applicant: Winbond Electronics Corp., Taichung (TW)

(72) Inventors: Po-Han Wu, Pingtung County (TW); Pai-Chun Tsai, Hsinchu (TW); Tzu-Ming Ou Yang, Taichung (TW); Shu-Ming Lee, Taichung (TW)

(73) Assignee: WINBOND ELECTRONICS CORP., Taichung (TW)

( * ) Notice: Subject to any disclaimer, the term of this patent is extended or adjusted under 35 U.S.C. 154(b) by 27 days.

(21) Appl. No.: 17/476,048

(22) Filed: Sep. 15, 2021

(65) Prior Publication Data
US 2023/0078443 A1    Mar. 16, 2023

(51) Int. Cl.
*H10B 12/00* (2023.01)
*H01L 21/308* (2006.01)

(52) U.S. Cl.
CPC ........... *H10B 12/03* (2023.02); *H01L 21/308* (2013.01); *H10B 12/50* (2023.02)

(58) Field of Classification Search
CPC ............... H01L 27/1085; H01L 21/308; H01L 27/10897
See application file for complete search history.

(56) References Cited

U.S. PATENT DOCUMENTS

2019/0181014 A1\* 6/2019 Chang ................. H01L 21/3086
2020/0203176 A1\* 6/2020 Wang ................. H01L 21/31144

FOREIGN PATENT DOCUMENTS

CN         109920730 A     6/2019

\* cited by examiner

*Primary Examiner* — Edward Chin
(74) *Attorney, Agent, or Firm* — Muncy, Geissler, Olds & Lowe, P.C.

(57) ABSTRACT

A method includes forming a stack of material layers to cover an array region and a periphery region of a substrate. A first patterned mask layer is formed, and the pattern of the first patterned mask layer is transferred to the stack of material layers, thereby forming a first array pattern and a first periphery pattern respectively in the array and periphery regions. A second patterned mask layer is provided above the first array and periphery patterns. The pattern of the second patterned mask is not aligned with the pattern of the first patterned mask. The pattern of the second patterned mask layer is transferred to form the first and second sacrificial patterns respectively in the array and periphery regions. The first array pattern, the first and second sacrificial patterns, and the first periphery pattern are simultaneously transferred to form a second array pattern and a second periphery pattern.

14 Claims, 11 Drawing Sheets

METHOD OF MANUFACTURING SEMICONDUCTOR STRUCTURE

BACKGROUND

Field of the Disclosure

The present disclosure relates to a method of manufacturing a semiconductor structure. In particular, it relates to a method of patterning material layers in an array region and a peripheral region of a semiconductor structure.

Description of the Related Art

In recent years, as the manufacturing technology of dynamic random access memory (DRAM) devices continues to develop toward the miniaturization of device sizes, many challenges have arisen. For example, the material layers in the array area and the peripheral area of a semiconductor structure are patterned separately in the conventional process is performed separately. Also, multiple precise steps are required for patterning those material layers in the conventional process due to the reduced device size. Therefore, the conventional process for patterning the material layers in the array area and the peripheral area of the semiconductor structure is costly and time consuming. Thus, although existing methods of manufacturing DRAM devices have generally been adequate for their intended purposes, they have not been entirely satisfactory in all respects. The industry still needs to improve the methods of manufacturing DRAM devices, especially to overcome various problems that may occur in the patterning process and caused by reductions in device size.

SUMMARY

In some embodiments of the disclosure, a method of manufacturing a semiconductor structure is provided. In some embodiments, the method includes forming a first stack of material layers over a substrate having an array region and a periphery region, wherein the first stack of material layers covers the array region and the periphery region, and the first stack of material layers comprises a first pattern transfer layer and a second pattern transfer layer. In some embodiments, the method also includes forming a first patterned mask layer over the first stack of material layers in the array region and the periphery region, wherein the first patterned mask layer exposes a portion of the top surface of the first stack of material layers. In some embodiments, the method also includes removing a portion of the first stack of material layers by using the first patterned mask layer as a mask, so as to transfer the pattern of the first patterned mask layer to the first stack of material layers. Therefore, a first array pattern is formed in the array region and a first periphery pattern is formed in the periphery region. In some embodiments, the method also includes providing a second patterned mask layer above the first array pattern in the array region and the first periphery pattern in the periphery region, wherein the pattern of the second patterned mask layer is misaligned with the pattern of the first patterned mask layer. In some embodiments, the method also includes transferring the pattern of the second patterned mask layer downwards by using the second patterned mask layer as a mask, so as to form a first sacrificial pattern in the array region and a second sacrificial pattern in the periphery region. In some embodiments, the method further includes transferring the first array pattern and the first sacrificial pattern to form a second array pattern in the array region, and simultaneously transferring the first periphery pattern and the second sacrificial pattern to form a second periphery pattern, in the periphery region.

In addition, in some embodiments, after the second array pattern and the second periphery pattern are formed, the method further includes forming a second stack of material layers over the second array pattern and the second periphery pattern; forming a third patterned mask layer over the second stack of material layers in the array region and the periphery region; and performing a self-aligned double patterning (SADP) process according to the pattern of the third patterned mask layer to form a stack of patterned material layers, wherein the stack of patterned material layers includes a third array pattern formed in the array region.

In addition, in some embodiments, after the third array pattern is formed, the method further includes forming a fourth patterned mask layer to cover the periphery region and expose the third array pattern in the array region; and removing portions of an underlying material layer that are exposed by the fourth patterned mask layer and the third array pattern, and also removing corresponding portions of the second array pattern. Therefore, the second array pattern is patterned to form a final array pattern.

BRIEF DESCRIPTION OF THE DRAWINGS

The present disclosure can be further understood by reading the subsequent detailed description and examples with references made to the accompanying drawings, wherein:

FIG. 1A, FIG. 1B, FIG. 2-FIG. 5, FIG. 6A, FIG. 6B, FIG. 7A, FIG. 7B, FIG. 8-FIG. 15, FIG. 16A, FIG. 16B and FIG. 17 are cross-sectional views of various stages of manufacturing a semiconductor structure in accordance with an embodiment of the present invention, wherein FIG. 1B is a cross-sectional view taken along sectional line B-B of the semiconductor structure of FIG. 1A;

FIG. 6B is a cross-sectional view taken along sectional line B-B of the semiconductor structure of FIG. 6A;

FIG. 7B is a cross-sectional view taken along sectional line B-B of the semiconductor structure of FIG. 7A; and FIG. 16B is a cross-sectional view taken along sectional line B-B of the semiconductor structure of FIG. 16A.

DETAILED DESCRIPTION

The present disclosure is described in detail with reference to the figures of the embodiments of the present disclosure. It should be appreciated, however, that the present disclosure can be embodied in a wide variety of implements and is not limited to embodiments described in the disclosure. Various features may be arbitrarily drawn at different scales for the sake of simplicity and clarity. Some embodiments are described below. Throughout the various views and illustrative embodiments, similar reference numbers are used to designate similar features/components.

Figure 1A:
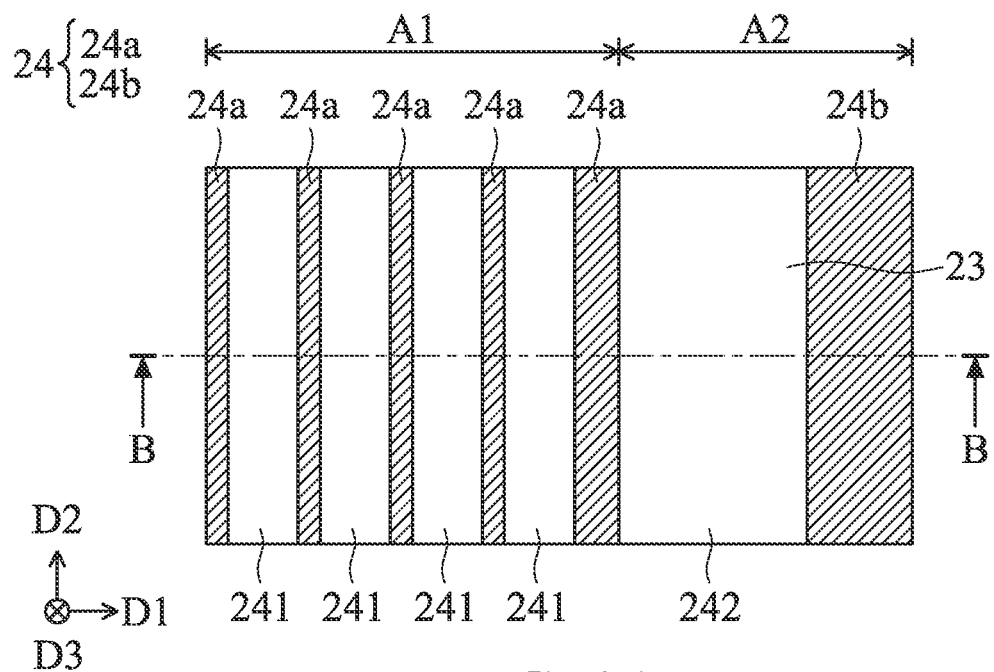
Figure 1B:
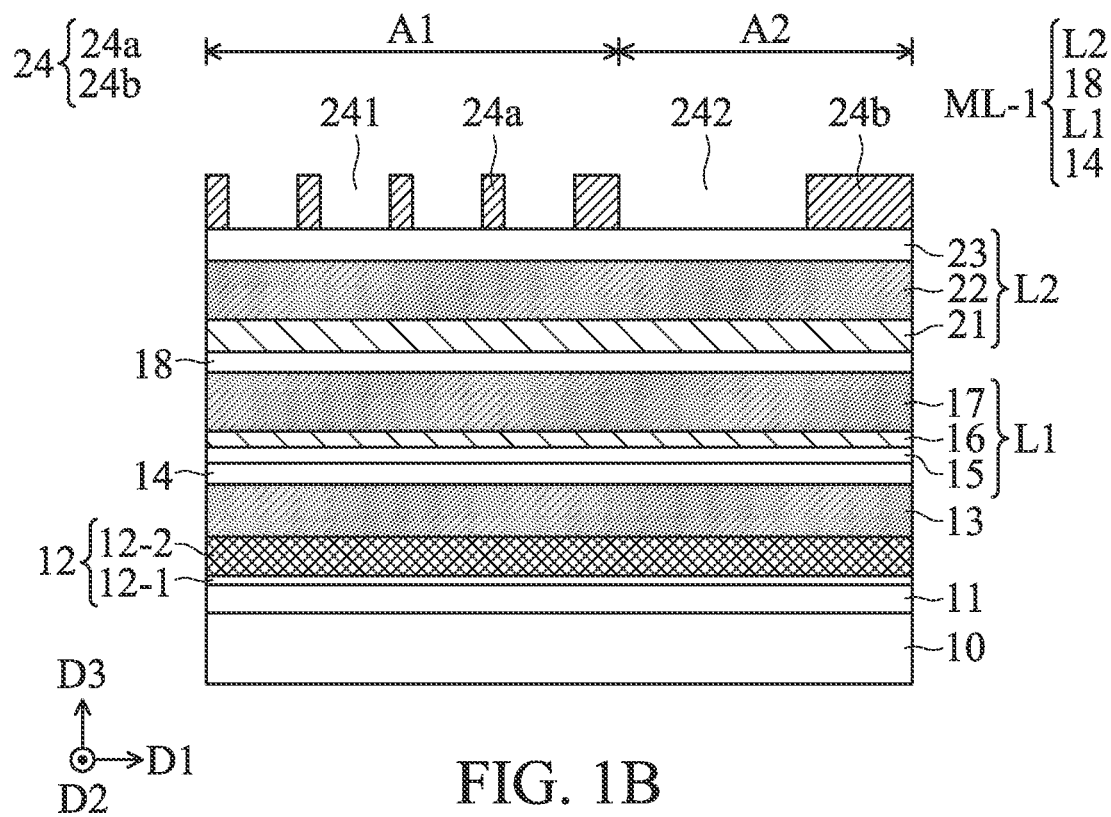

FIG. 1A-FIG. 17 are cross-sectional views of various stages of manufacturing a semiconductor structure in accordance with an embodiment of the present invention. Referring to FIG. 1A and FIG. 1B, a substrate 10 and a first stack of material layers ML-1 over the substrate 10 are provided. The substrate 10 includes an array region A1 and a peripheral region A2. In one embodiment, the substrate 10 includes a semiconductor material. In one embodiment, the substrate 10 includes silicon, gallium arsenide, gallium nitride, germanium silicide, another suitable material, or a combination thereof. In one embodiment, the substrate 10 is a silicon-on-insulator (SOI) substrate. Various components such as buried word lines, isolation structures, bit lines, etc. may be formed in the substrate 10 and above the substrate 10. To briefly describe this exemplified embodiment, those components are omitted in the diagrams for the sake of simplicity and clarity.

The first stack of material layers ML-1 is formed on the substrate 10 and covers the array area A1 and the peripheral area A2, in accordance with some embodiments of the present disclosure. The first stack of material layers ML-1 includes several material layers, such as a dielectric layer 14, a pattern transfer layer L1, a dielectric layer 18 and a pattern transfer layer L2 that are sequentially formed over the substrate 10. In one embodiment, the method for forming the material layers in the first stack of material layers ML-1 may include physical vapor deposition (PVD), chemical vapor deposition (CVD), atomic layer deposition (ALD), spin coating, another suitable process, or a combination thereof. In one embodiment, the dielectric layer 14 and the dielectric layer 18 include one or more insulating materials, such as silicon nitride (SiN). In one example, the thickness of the dielectric layer 18 is about (but not limited to) 30 nm, and the thickness of the dielectric layer 14 is about (but not limited to) 70 nm.

In one embodiment, the pattern transfer layer L1 includes a nitrogen-containing layer 15, a polysilicon layer 16 and a carbon-containing layer 17 sequentially formed over the dielectric layer 14. The nitrogen-containing layer 15 and the dielectric layer 14 include, for example, different materials. In this example, the nitrogen-containing layer 15 is an oxygen-rich silicon oxynitride (O-rich SiON). The carbon-containing layer 17 includes carbides, for example, diamond-like carbon, an amorphous carbon film, and a highly selective transparent carbon-containing layer. Also, the thickness of the carbon-containing layer 17 may be (but is not limited) in a range of about 70 nm to about 100 nm. In this example, the carbon-containing layer 17 is a highly selective transparent carbon-containing layer. Although the pattern transfer layer L1 described herein includes the nitrogen-containing layer 15, the polysilicon layer 16 and the carbon-containing layer 17 for illustration, the pattern transfer layer L1 is not limited to those material layers. In some other embodiments, the pattern transfer layer L1 can also be formed by a combination of other material layers suitable for pattern transfer.

In one embodiment, the pattern transfer layer L2 includes a polysilicon layer 21, a carbon-containing layer 22 and an anti-reflective layer 23 sequentially formed over the dielectric layer 18. The carbon-containing layer 22 includes, for example, carbides such as diamond-like carbon, an amorphous carbon film, and a highly selective transparent carbon-containing layer. In this example, the carbon-containing layer 22 is a spin-on carbon layer. The material of the anti-reflective layer 23 includes, for example, organic polymers, carbon, or silicon oxynitride. Although the pattern transfer layer L2 described herein includes the polysilicon layer 21, the carbon-containing layer 22, and the anti-reflective layer 23 for illustration, the pattern transfer layer L2 in the disclosure is not limited to those material layers. In some other embodiments, the pattern transfer layer L2 can also be formed by a combination of other material layers suitable for pattern transfer.

In one embodiment, a target material layer 12 and other material layers are formed between the substrate 10 and the first stack of material layers ML-1. The target material layer 12 covers the array region A1 and the peripheral region A2. For example, the material layers disposed between the substrate 10 and the first stack of material layers ML-1 include a cap layer 11, a target material layer 12 and a carbide layer 13 that are sequentially formed over the substrate 10. The methods for forming the cap layer 11, the target material layer 12 and the carbide layer 13 may include, for example, PVD, CVD, ALD, spin coating, another other suitable process, or a combination thereof.

The cap layer 11 is, for example, a silicon nitride layer, or formed of another suitable insulating material. The target material layer 12 is, for example, a single layer or a multi-layered structure that includes one or more conductive materials. In one embodiment, the target material layer 12 includes tungsten (W), tungsten nitride (WN), copper (Cu), aluminum copper alloy, polysilicon, silicon germanium (SiGe), another suitable conductive material, or a combination thereof. In this example, the target material layer 12 may include, for example, a tungsten nitride layer 12-1 and a tungsten layer 12-2. The carbide layer 13 may include, for example, diamond-like carbon, an amorphous carbon film, and a highly selective transparent carbon-containing layer. In this example, the carbide layer 13 is a highly selective transparent carbon-containing layer.

Referring again to FIG. 1A and FIG. 1B, a patterned mask layer 24 (for example, a patterned photoresist layer) is provided above the first stack of material layers ML-1. Also, the patterned mask layer 24 exposes portions of the top surface of the first stack of material layers ML-1. In some embodiments, the patterned mask layer 24 includes a mask pattern 24a and a mask pattern 24b that are formed on the anti-reflective layer 23 and expose portions of the top surface of the anti-reflective layer 23. The mask pattern 24a and the mask pattern 24b are formed in the array region A1 and the peripheral region A2, respectively. In addition, the mask pattern 24a includes several openings 241, and the mask pattern 24b includes several openings 242 (one of the openings 242 depicted in the drawings).

Figure 4:
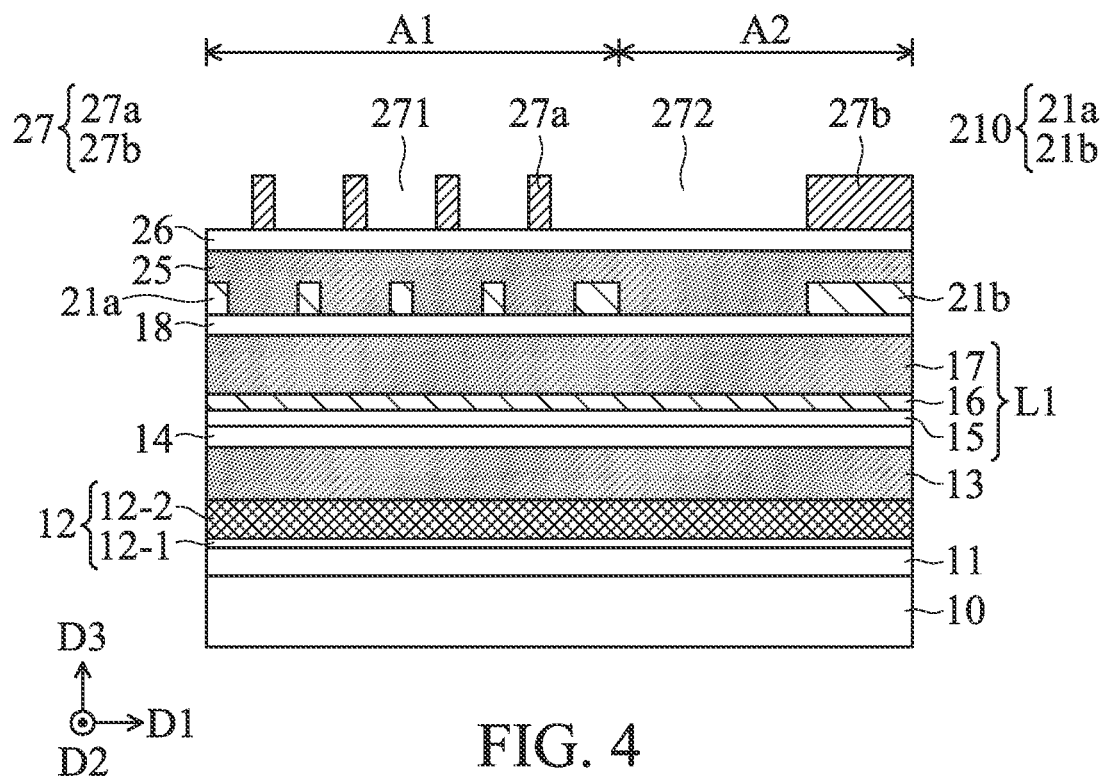
Figure 5:
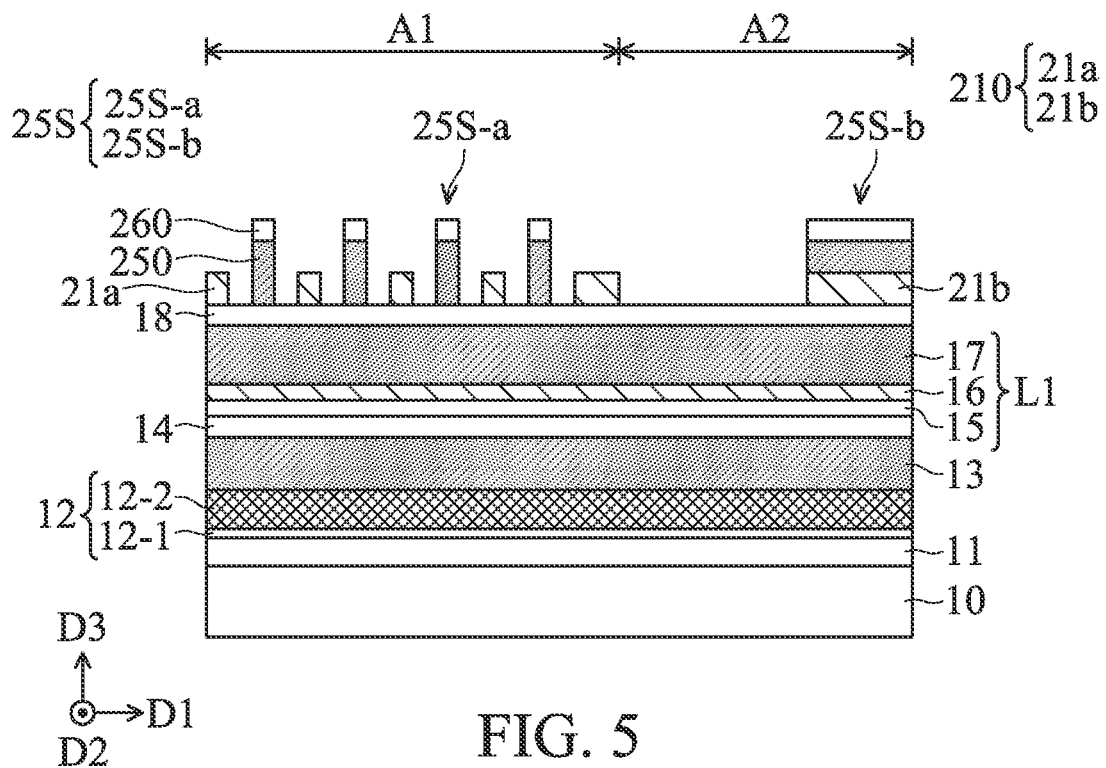
Figure 6A:
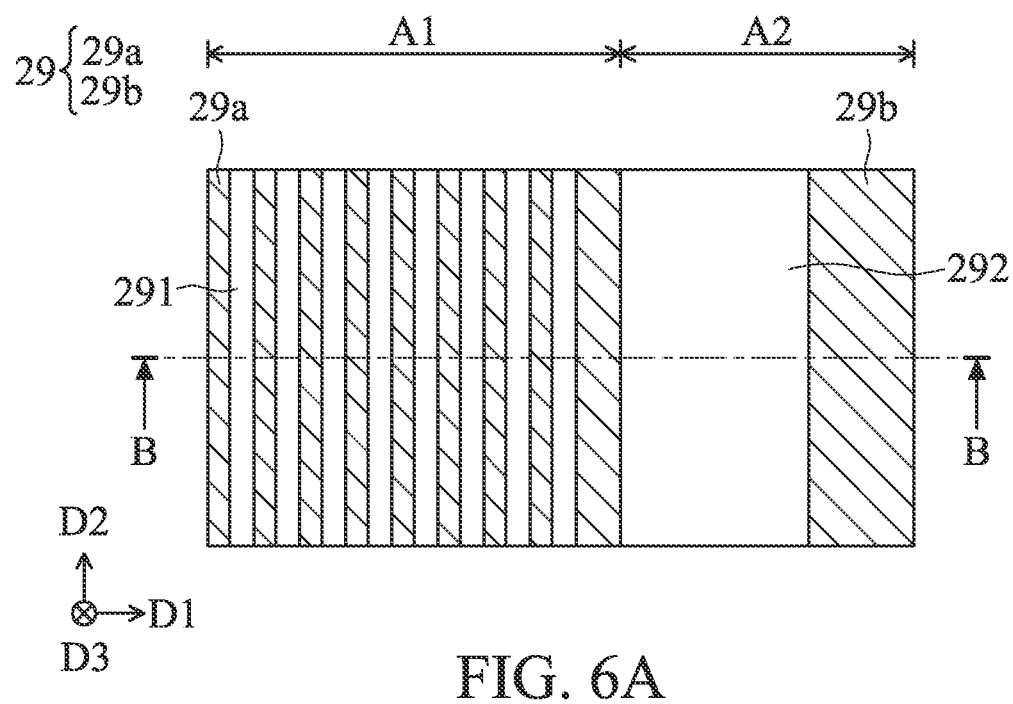
Figure 6B:
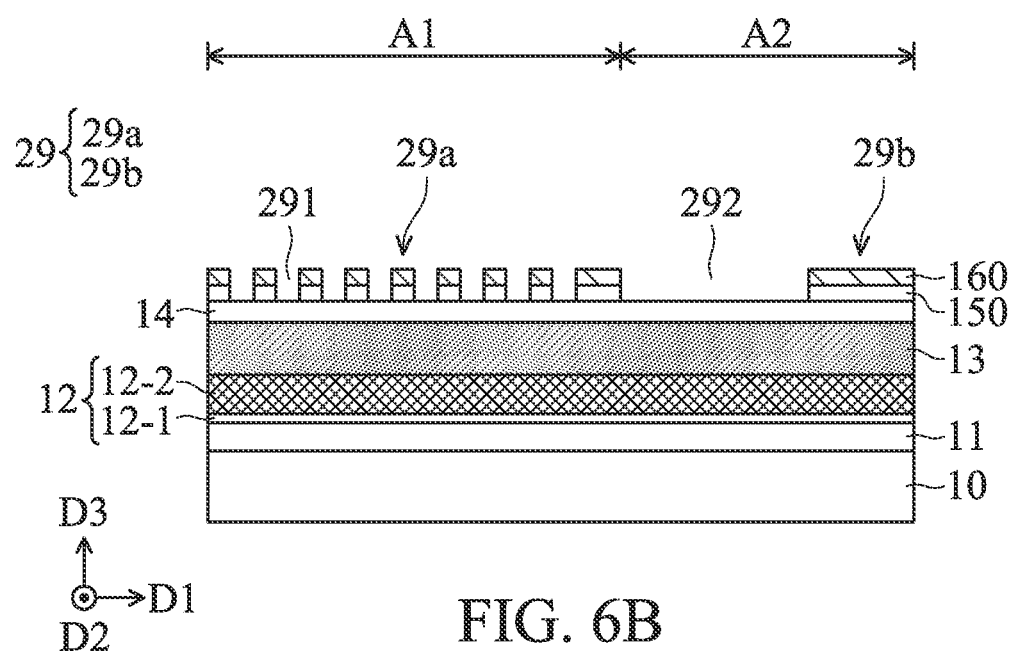

Next, referring to FIG. 1A-FIG. 1B, FIG. 2-FIG. 5, FIG. 6A, and FIG. 6B, the present disclosure implements a two-stage lithography process to simultaneously define a final peripheral pattern in the peripheral region A2 (for example, the second peripheral pattern 29b in FIG. 6A and FIG. 6B) and a linear pattern extending along a specific direction in the array region A1 (for example, the second array pattern 29a in FIG. 6A and FIG. 6B). In general, the first stage of the lithographic process (as illustrated in FIG. 1A, FIG. 1B, FIG. 2 and FIG. 3) is performed to form the first array pattern 21a and the first peripheral pattern 21b (FIG. 3) in a low pattern density, and then the second stage of the lithographic process (as illustrated in FIG. 4, FIG. 5, FIG. 6A and FIG. 6B) is performed to further increase the pattern density of the first array pattern 21a and the first peripheral pattern 21b, thereby forming the second array pattern 29a and the second peripheral pattern 29b (FIG. 6A and FIG. 6B) in accordance with some embodiments of the present disclosure.

Figure 2:
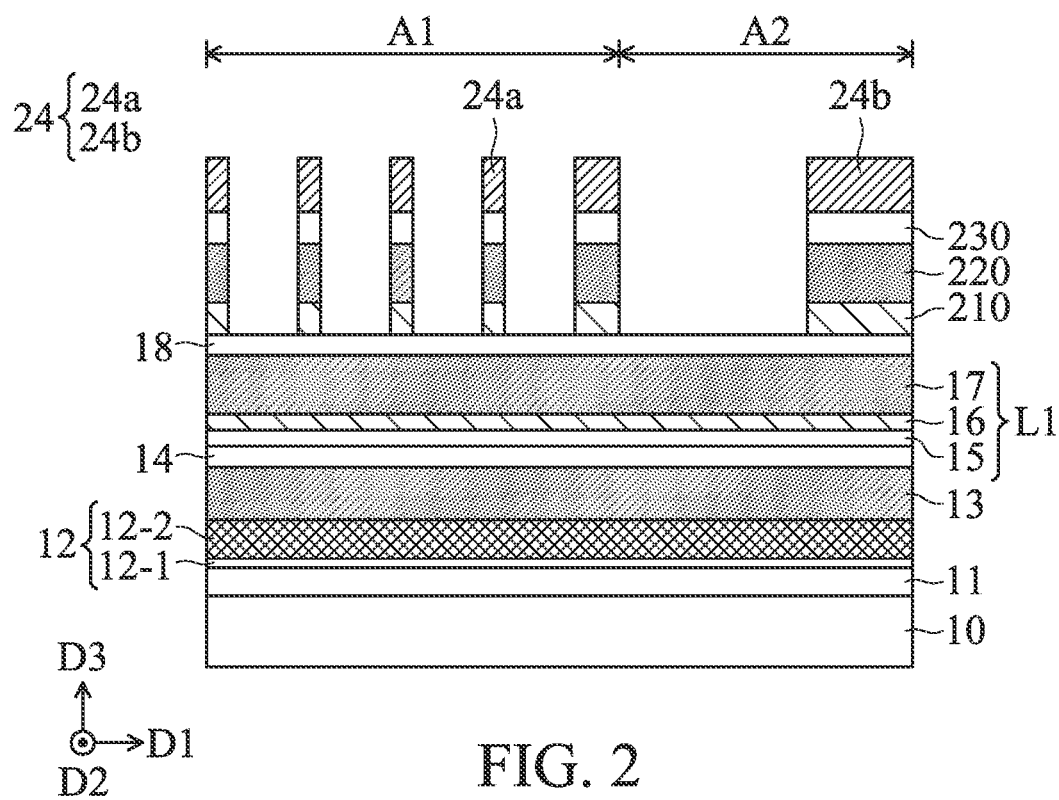

Next, referring to FIG. 1A, FIG. 1B and FIG. 2, the portions of the pattern transfer layer L2 that are uncovered by the patterned mask layer 24 are removed by using the patterned mask layer 24 as a mask. In one embodiment, a dry etching process is performed to remove the portions of the anti-reflective layer 23 that are exposed by the openings 241 and 242, and also remove the corresponding portions of the carbon-containing layer 22 and the polysilicon layer 21 under the exposed portions of the anti-reflective layer 23. As shown in FIG. 2, after etching, the pattern of the patterned mask layer 24 is transferred to the underlying pattern transfer layer L2 to form the anti-reflective layer 230, the carbon-containing layer 220, and the polysilicon layer 210. In this exemplified step, the dielectric layer 18 functions as an etch stop layer.

Figure 3:
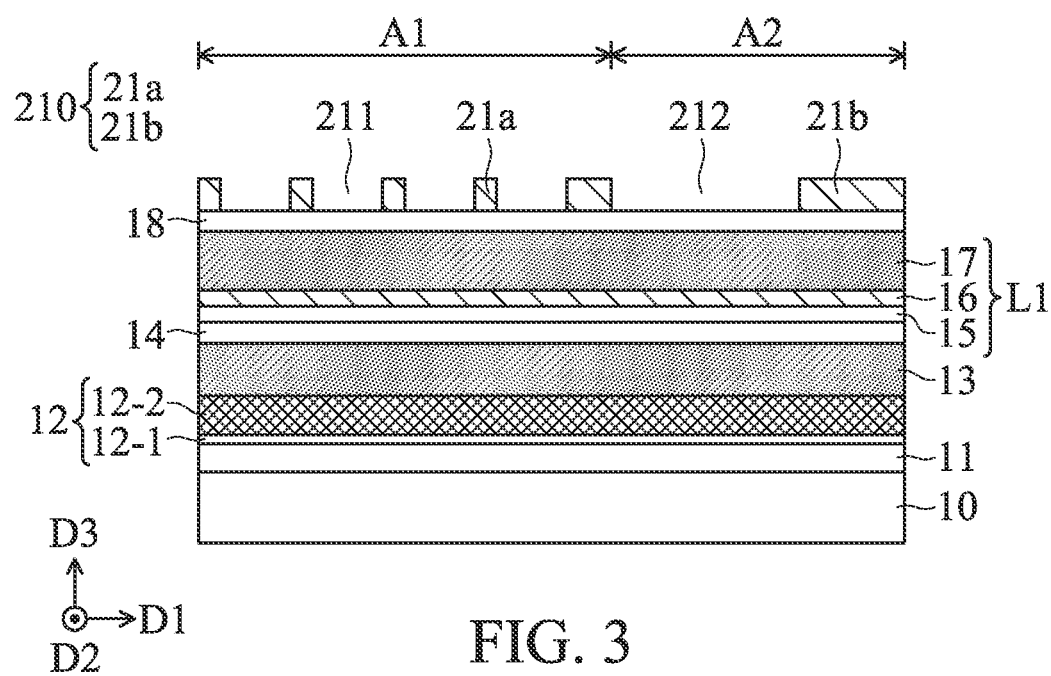

Next, referring to FIG. 3, in some embodiments, the patterned mask layer 24, the anti-reflective layer 230 and the carbon-containing layer 220 are removed, and the polysilicon layer 210 are remained on the dielectric layer 18. The polysilicon layer 210 includes a first array pattern 21a in the array region A1 and a first peripheral pattern 21b in the peripheral region A2. In addition, the first array pattern 21a includes several openings 211, and the first peripheral pattern 21b includes several openings 212 (one of the openings 212 depicted in FIG. 3). The openings 211 and the opening 212 expose portions of the top surface of the dielectric layer 18. In one embodiment, the first array pattern 21a and the first peripheral pattern 21b extend in the direction D2. In addition, the first array pattern 21a and the first peripheral pattern 21b are spaced apart from each other in the direction D1, in accordance with some embodiments of the present disclosure.

Next, referring to FIG. 4, in some embodiments, a carbon-containing layer 25 and an anti-reflective layer 26 are sequentially formed over the polysilicon layer 210. The methods for forming the carbon-containing layer 25 and the anti-reflective layer 26 may include PVD, CVD, ALD, spin coating, another other suitable process, or a combination thereof. The carbon-containing layer 25 completely covers the first array pattern 21a in the array region A1 and the first peripheral pattern 21b in the peripheral region A2, in accordance with some embodiments of the present disclosure. Also, the carbon-containing layer 25 fills the openings 211 and 212. Material examples of the carbon-containing layer 25 include carbides, such as diamond-like carbon, an amorphous carbon film and a highly selective transparent carbon-containing layer. In this example, the carbon-containing layer 25 is a spin-on carbon layer. The material of the anti-reflective layer 26 includes, for example, organic polymers, carbon, or silicon oxynitride.

Referring again to FIG. 4, a patterned mask layer 27 (for example, a patterned photoresist layer) is provided above the anti-reflective layer 26. The patterned mask layer 27 includes a mask pattern 27a and a mask pattern 27b that are formed on the anti-reflective layer 26 and expose portions of the top surface of the anti-reflective layer 26. The mask pattern 27a and the mask pattern 27b are formed in the array region A1 and the peripheral region A2, respectively. In addition, the mask pattern 27a includes several openings 271, and the mask pattern 27b includes several openings 272 (one of the openings 272 depicted in FIG. 4). In addition, the pattern of the patterned mask layer 27 is not aligned with the pattern of the polysilicon layer 210 (that is, the pattern of the patterned mask layer 24). For example, the pattern of the patterned mask layer 27 and the pattern of the polysilicon layer 210 are misaligned with each other in the direction D1. As shown in FIG. 4, the openings 271 of the mask pattern 27a correspond to the first array pattern 21a of the polysilicon layer 210 below, and the openings 272 of the mask pattern 27b correspond to the first peripheral pattern 21b of the polysilicon layer 210 below, in accordance with some embodiments of the present disclosure. In one embodiment, the extending direction of the mask pattern 24a is substantially the same as the extending direction of the mask pattern 27a.

It should be noted that the mask pattern 27b in the peripheral region A2 depicted in the drawings only shows a portion of one exemplified pattern that is adjacent to the array region A1. In other non-depicted areas of the peripheral region A2, the density of the peripheral pattern may also be increased by arranging two misaligned mask patterns, such as the misaligned mask patterns 24a and 27a implemented in the array region A1. Therefore, the actual pattern of the mask pattern 27b in the peripheral region A2 can be varied, depending on the configuration requirements of the to-be-formed peripheral pattern in the application.

Next, as shown in FIG. 5, the portions of the anti-reflective layer 26 and the carbon-containing layer 25 that are uncovered by the patterned mask layer 27 are removed by using the patterned mask layer 27 as a mask. In one embodiment, a dry etching process is performed to remove the portions of the anti-reflective layer 26 that are exposed by the openings 271 and 272, and also remove the corresponding portions of the carbon-containing layer 25 under the exposed portions of the anti-reflective layer 26. As shown in FIG. 5, after etching, the pattern of the patterned mask layer 27 is transferred to the underlying anti-reflective layer 26 and carbon-containing layer 25, thereby forming the anti-reflective layer 260 and the carbon-containing layer 250. In this exemplified step, the dielectric layer 18 functions as an etch stop layer. In some embodiments, after the pattern transfer for forming the anti-reflective layer 260 and the carbon-containing layer 250 is completed, the patterned mask layer 27 is removed, such as by an ashing process.

In addition, as shown in FIG. 5, the stacked carbon-containing layer 250 and the anti-reflection layer 260 form a sacrificial pattern layer 25S. The sacrificial pattern layer 25S includes a first sacrificial pattern 25S-a in the array region A1 and a second sacrificial pattern 25S-b in the peripheral region A2. In one embodiment, the first sacrificial pattern 25S-a extends in the direction D2. Also, the first sacrificial pattern 25S-a and the second sacrificial pattern 25S-b are spaced apart from each other in the direction D1. The direction D1 is different from the direction D2. In addition, in this exemplified embodiment, the first sacrificial patterns 25S-a and the first array patterns 21a in the array region A1 are alternately arranged on the dielectric layer 18. The second sacrificial pattern 25S-b in the peripheral region A2 may cover a portion of the first peripheral pattern 21b, or is misaligned with a portion of the first peripheral pattern 21b, depending on the peripheral pattern to be formed finally. It should be noted that the positions of the second sacrificial pattern 25S-b and the first peripheral pattern 21b in FIG. 5 is merely an example, and the present disclosure is not limited thereto.

Next, referring to FIG. 6A and FIG. 6B, the portions of the dielectric layer 18 and the pattern transfer layer L1 that are uncovered by the sacrificial pattern layer 25S and the polysilicon layer 210 are removed by using the sacrificial pattern layer 25S and the polysilicon layer 210 as a mask. In one embodiment, a dry etching process is performed to remove the portions of the dielectric layer 18 that are exposed by the openings of the sacrificial pattern layer 25S and the polysilicon layer 210, and further remove the corresponding portions of the carbon-containing layer 17, the polysilicon layer 16 and the nitrogen-containing layer 15 under the exposed portions of the dielectric layer 18. As shown in FIG. 6B, after etching, the patterns of the sacrificial pattern layer 25S and the polysilicon layer 210 are transferred to the underlying dielectric layer 18 and the pattern transfer layer L1, so as to form the remaining portions of the dielectric layer 18 (not shown), the remaining portions of the carbon-containing layer 17 (not shown), the remaining portions of the polysilicon layer 16 (also referred as the polysilicon layer 160) and the remaining portions of the nitrogen-containing layer 15 (also referred as the nitrogen-containing layer 150). In this exemplified step, the dielectric layer 14 functions as an etch stop layer.

In some embodiments, the sacrificial pattern layer 25S, the polysilicon layer 210, the remaining portions of the dielectric layer 18 and the remaining portions of the carbon-containing layer 17 are then removed by one or more steps including an ashing process, an etching process, and the like. As shown in FIG. 6B, the polysilicon layer 160 and the nitrogen-containing layer 150 form a polysilicon pattern layer 29. In some embodiments, the polysilicon pattern layer 29 includes the second array pattern 29a in the array region A1 and the second peripheral pattern 29b in the peripheral region A2. In addition, the second array pattern 29a includes several openings 291, and the second peripheral pattern 29b includes several openings 292 (one of the openings 292 depicted in FIG. 6A and FIG. 6B). The openings 291 and the openings 292 expose portions of the top surface of the dielectric layer 14.

So far, the exemplified embodiment of the present disclosure has defined the final peripheral pattern (i.e. the second peripheral pattern 29b) in the peripheral region A2 through the two-stage lithography process described above. Also, a pattern (i.e. the second array pattern 29a) extending in a specific direction in the array region A1 is formed while the final peripheral pattern 29b in the peripheral region A2 is defined. Referring to FIG. 7A, FIG. 7B, and FIG. 8-FIG. 13, in some embodiments of the present disclosure, a SADP process is then performed to define a pattern (for example, the third array pattern 43a' in FIG. 13) extending in another specific direction in the array region A1.

Figure 7A:
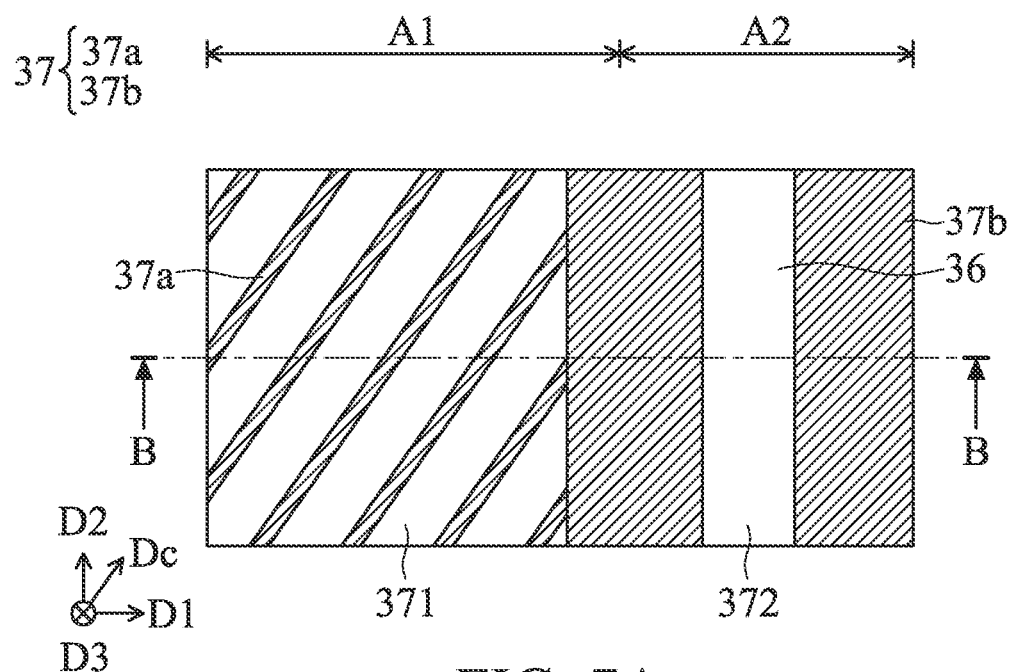
Figure 7B:
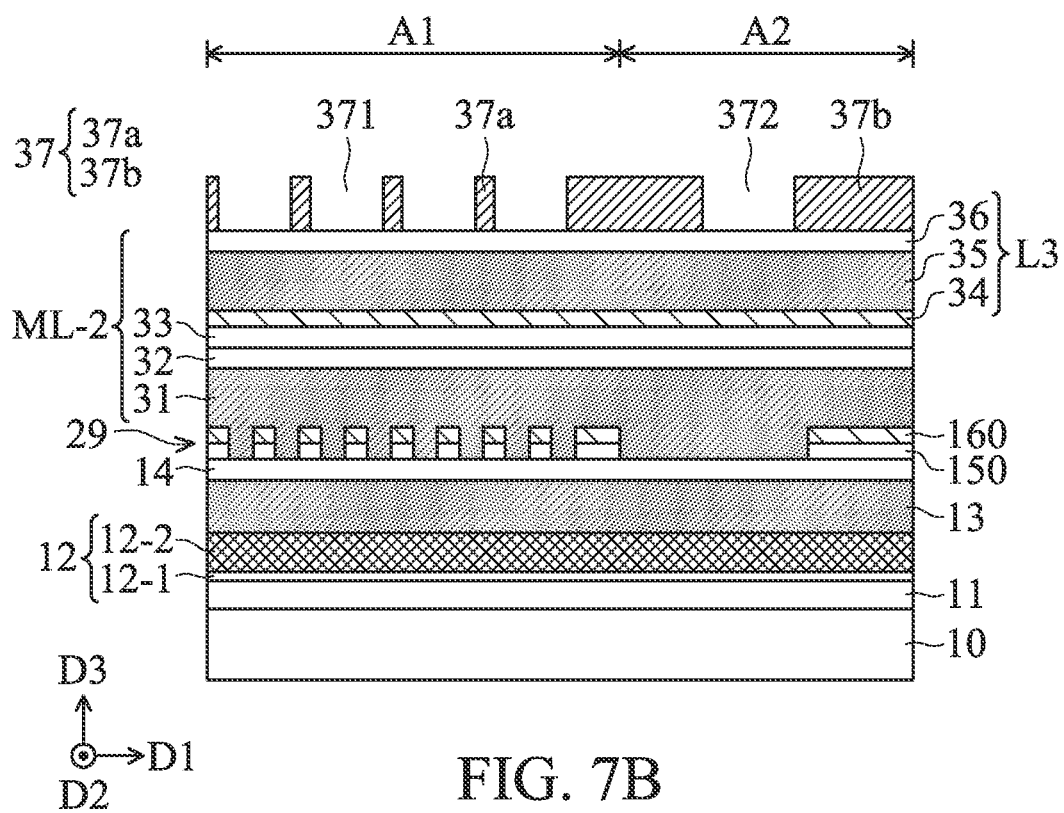

Referring to FIG. 7A and FIG. 7B, a second stack of material layers ML-2 is formed over the polysilicon pattern layer 29. The second stack of material layers ML-2 may include several material layers, such as a carbon-containing layer 31, a nitrogen-containing layer 32, a silicon oxide layer 33 and a pattern transfer layer L3 that are sequentially formed over the second stack of material layers ML-2. The method for forming the material layers in the second stack of material layers ML-2 may include PVD, CVD, ALD, spin coating, another suitable process, or a combination thereof. The carbon-containing layer 31 completely covers the second array pattern 29a in the array region A1 and the second peripheral pattern 29b in the peripheral region A2, in accordance with some embodiments of the present disclosure. Also, the carbon-containing layer 31 fills the openings 291 and 292. The carbon-containing layer 31 may include diamond-like carbon, an amorphous carbon film, a highly selective transparent carbon-containing layer, or a combination thereof. In this example, the carbon-containing layer 31 is a spin-on carbon layer. The nitrogen-containing layer 32 and the dielectric layer 14 include, for example, different materials. In this example, the nitrogen-containing layer 32 is an nitrogen-rich silicon oxynitride (N-rich SiON). The silicon oxide layer 33 may include tetraethyl orthosilicate (TEOS) layer.

In one embodiment, the pattern transfer layer L3 includes a polysilicon layer 34, a carbon-containing layer 35 and an anti-reflective layer 36 sequentially formed over the silicon oxide layer 33. In some embodiments, the carbon-containing layer 35 includes carbides, for example, diamond-like carbon, an amorphous carbon film, and a highly selective transparent carbon-containing layer. In this example, the carbon-containing layer 35 is a spin-on carbon layer. The material of the anti-reflective layer 36 includes, for example, organic polymers, carbon, silicon oxynitride, or another suitable material. Although the pattern transfer layer L3 described herein includes the polysilicon layer 34, the carbon-containing layer 35, and the anti-reflective layer 36 for illustration, the pattern transfer layer L3 in the disclosure is not limited to those material layers. In some other embodiments, the pattern transfer layer L3 can also be formed by a combination of other material layers suitable for pattern transfer.

Referring again to FIG. 7A and FIG. 7B, a patterned mask layer 37 (for example, a patterned photoresist layer) is provided above the second stack of material layers ML-2. Also, the patterned mask layer 37 exposes portions of the top surface of the second stack of material layers ML-2. In some embodiments, the patterned mask layer 37 includes a mask pattern 37a and a mask pattern 37b that are formed on the anti-reflective layer 36 and expose portions of the top surface of the anti-reflective layer 36. The mask pattern 37a and the mask pattern 37b are formed in the array region A1 and the peripheral region A2, respectively. In addition, the mask pattern 37a includes several openings 371, and the mask pattern 37b includes several openings 372 (one of the openings 372 depicted in the drawings).

In some embodiments, as shown in FIG. 7A and FIG. 7B, the mask pattern 37a includes several strips that are spaced apart from each other in the direction D1 and extend in the direction Dc. In some embodiments, an included angle between the direction Dc and the direction D1 is greater than 0 degree and less than 90 degrees. However, the present disclosure is not limited to the mask pattern 37a exemplified in FIG. 7A. In some other embodiments, the mask pattern 37a may include several strips that are spaced apart from each other in the direction D2 and substantially extend in the direction D1.

Figure 8:
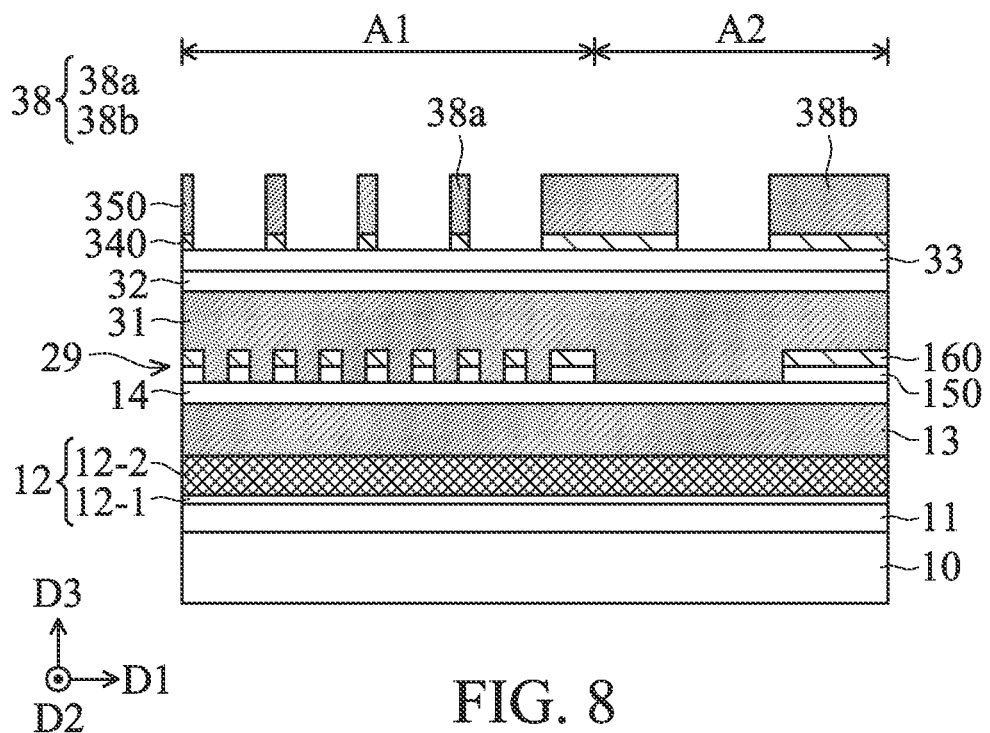

Next, referring to FIG. 8, in some embodiments, the portions of the pattern transfer layer L3 that are uncovered by the patterned mask layer 37 are removed by using the patterned mask layer 37 as a mask. In one embodiment, a dry etching process is performed to remove the portions of the anti-reflective layer 36 that are exposed by the openings 371 and 372, and also remove the corresponding portions of the carbon-containing layer 35 and the polysilicon layer 34 under the exposed portions of the anti-reflective layer 36. As shown in FIG. 8, after etching, the pattern of the patterned mask layer 37 is transferred to the underlying pattern transfer layer L3 to form the remaining anti-reflective layer 36 (not shown), the carbon-containing layer 350, and the polysilicon layer 340. In this exemplified step, the silicon oxide layer 33 functions as an etch stop layer.

After the pattern of the patterned mask layer 37 has been transferred to the underlying pattern transfer layer L3, the patterned mask layer 37 and the remaining anti-reflective layer 36 are removed, for example, by an ashing process, an etching process, and the like. As shown in FIG. 8, the carbon-containing layer 350 and the polysilicon layer 340 form a core pattern layer 38. The core pattern layer includes a first core pattern 38a in the array region A1 and a second core pattern 38b in the periphery region A2, in accordance with some embodiments of the present disclosures.

Figure 9:
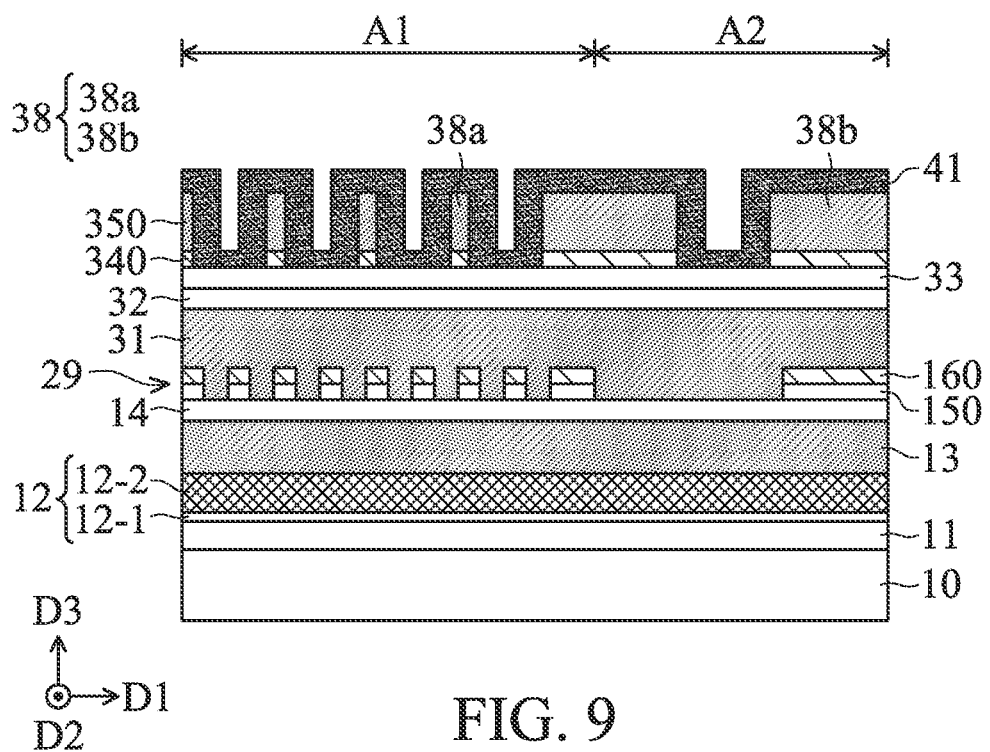

Next, as shown in FIG. 9, a spacer material layer 41 is deposited on the silicon oxide layer 33 and the core pattern layer 38. The spacer material layer 41 is conformally formed on and covers the core pattern layer 38. The spacer material layer 41 covers the top surfaces and sidewalls of the first core pattern 38a and the second core pattern 38b, and also covers the exposed portions of the silicon oxide layer 330, in accordance with some embodiments of the present disclosure. The spacer material layer 41 may include, for example, an oxide, and its formation method may include a PVD process, a CVD process, an ALD, a spin-coating process, another suitable process, or a combination thereof. The spacer material layer 41 and the silicon oxide layer 33 may include the same material or different materials. In this example, the spacer material layer 41 is a tetraethyl orthosilicate (TEOS) layer.

Figure 10:
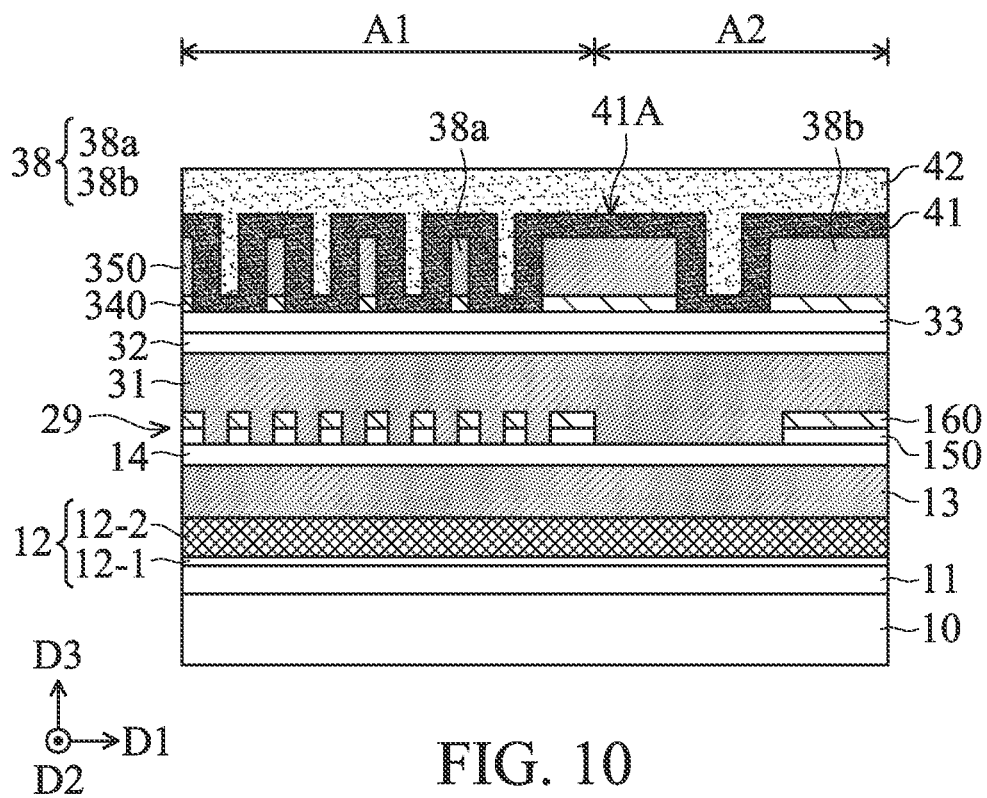

Next, referring to FIG. 10, a planarization layer 42 is formed over the spacer material layer 41. The planarization layer 42 completely covers the spacer material layer 41 and fills the spaces between the protruding portions of the spacer material layer 41. The planarization layer 42 may include an organic dielectric layer. The planarization layer 42 may include diamond-like carbon, an amorphous carbon film, a highly selective transparent carbon-containing layer, or another suitable material. In some embodiments, the planarization layer 42 can be formed by PVD, CVD, ALD, spin coating, another suitable process, or a combination thereof. In this example, the planarization layer 42 is a spin-on carbon layer.

Figure 11:
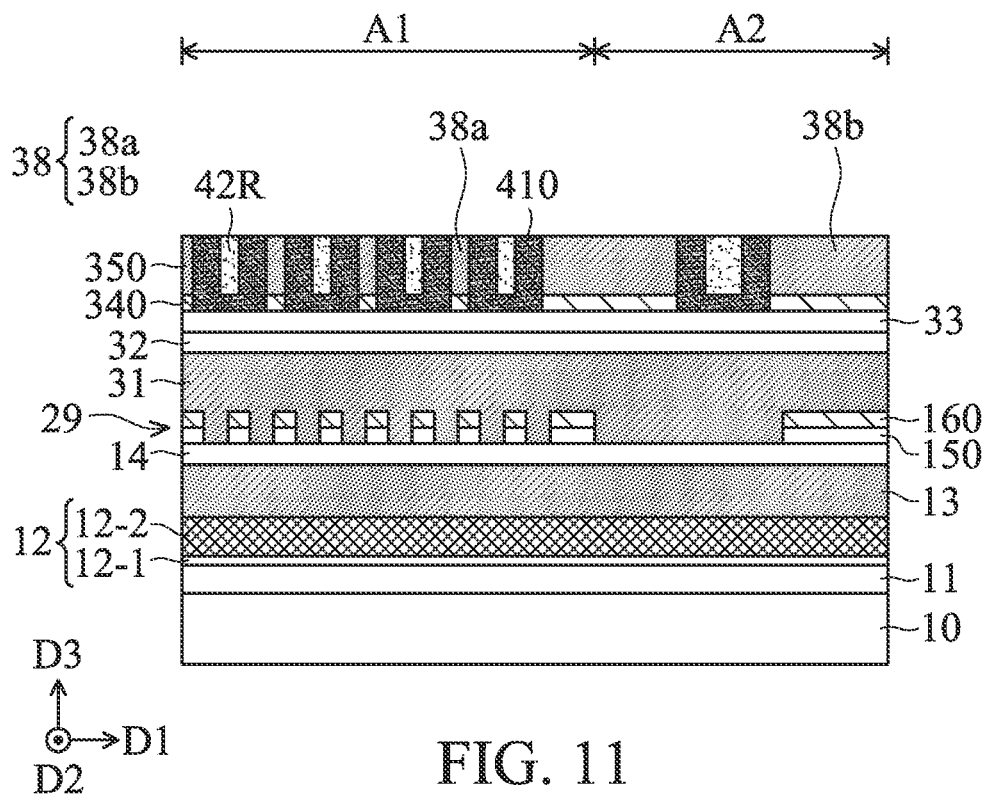

Next, referring to FIG. 11, portions of the planarization layer 42 and portions of the spacer material layer 41 are removed until the top surface of the core pattern layer 38 is exposed. The portions of the planarization layer 42 and the portions of the spacer material layer 41 can be removed by an etch back process, a chemical mechanical polishing process, another suitable process, or a combination thereof. After this removal step, the remaining planarization layer 42R fills the spaces between remaining portions of the spacer material layer 41, as shown in FIG. 11. In addition, after this removal step, the top surface of the planarization layer 42R is substantially level with the top surface of the spacer material layer 41, in accordance with some embodiments of the present disclosure.

Figure 12:
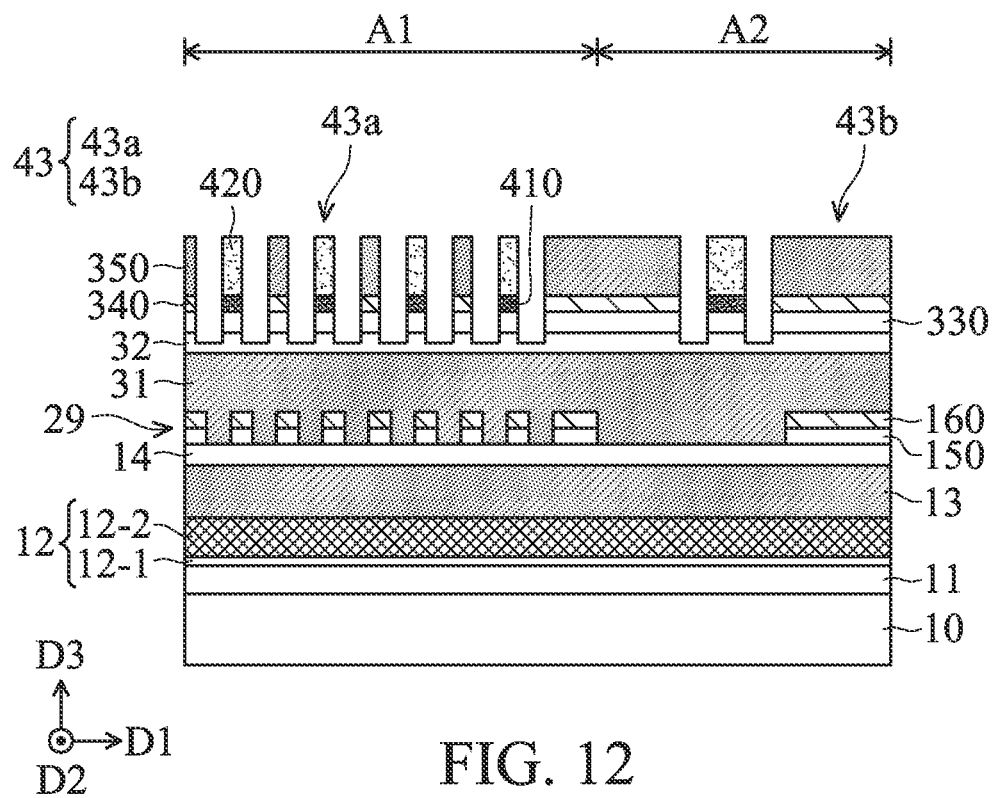

Next, referring to FIG. 12, the portions of the spacer material layer 41 and the portions of the silicon oxide layer 33 that are uncovered by the planarization layer 42R and the core pattern layer 38 are removed by using the planarization layer 42R and the core pattern layer 38 as a mask, thereby forming a patterned stack layer 43. In one embodiment, the portions of the spacer material layer 41 and the silicon oxide layer 33 that are uncovered by the planarization layer 42R and the core pattern layer 38 are removed by, for example, a dry etching process, until the nitride layer 32 is exposed. In this exemplified step, the nitrogen-containing layer 32 functions as an etch stop layer.

In some embodiments, as shown in FIG. 12, the patterned stack layer 43 includes two material stacks arranged alternately, and each of the material stacks has three stacked layers (which can be referred as a three-layer material stack). The first three-layer material stack includes the carbon-containing layer 350, the polysilicon layer 340, and the silicon oxide layer 330 from top to bottom. The second three-layer material stack includes the planarization layer 420, the spacer material layer 410 and the silicon oxide layer 330 from top to bottom. In addition, the material stacks of the patterned stack layer 43 can be divided according to the positions of the material stacks. In some embodiments, the patterned stack layer 43 includes several first stacks 43a in the array region A1 and several second stacks 43b in the peripheral region A2.

Figure 13:
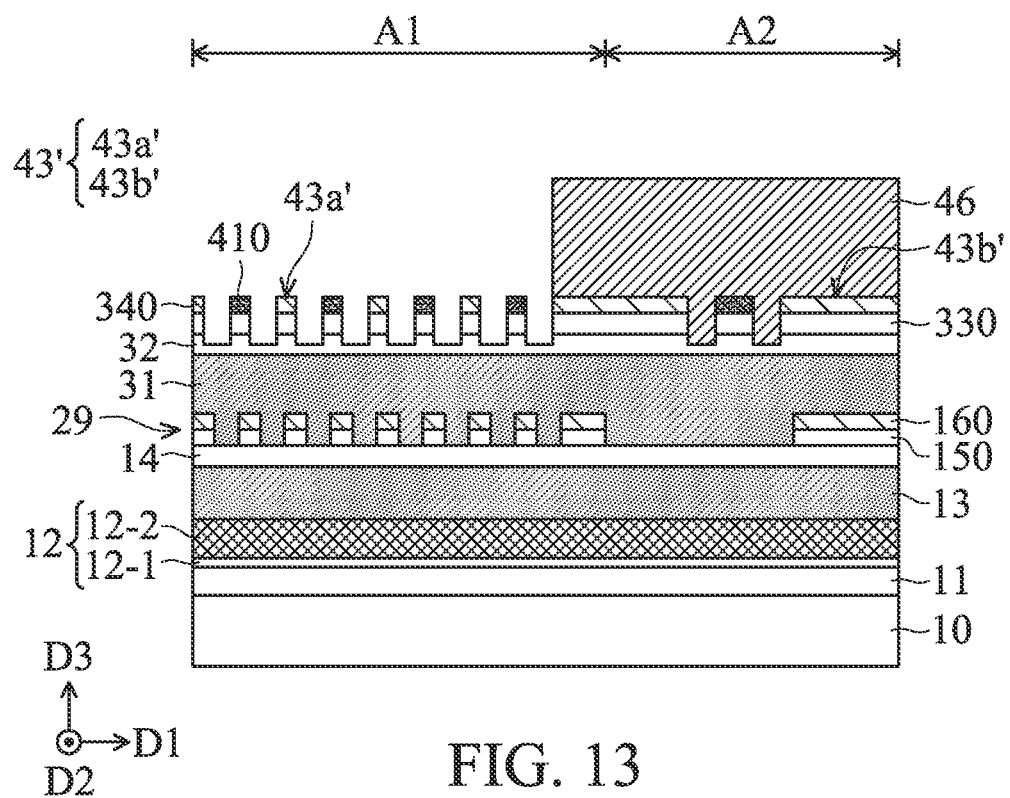

Next, referring to FIG. 13, the carbon-containing layer 350 and the planarization layer 420 are removed to form a stack of patterned material layers 43'. The stack of patterned material layers 43' includes a first material stack 43a' in the array region A1 and a second material stack 43b' in the peripheral region A2, in accordance with some embodiments of the present disclosure. In this example, the first material stack 43a' can provide a third array pattern. In some embodiments, the third array pattern (i.e. the first material stack 43a') in the array region A1 includes several strips that are spaced apart from each other in the direction D1 and extend in the direction Dc (as shown in FIG. 7A). In some other embodiments, the third array pattern (i.e. the first material stack 43a') may include several strips that are spaced apart from each other in the direction D2 and substantially extend in the direction D1.

So far, the exemplified embodiment of the present disclosure defines a pattern, for example, the third array pattern (i.e. the first material stack 43a'), extending in another direction in the array region A1 by using the aforementioned SADP process. Referring to FIG. 13 to FIG. 16 and the related descriptions of the process, an etching process is then performed to etch the material layers under the third array pattern (i.e. the first material stack 43a') by using the first material stack 43a' as an etching mask. Accordingly, the second array pattern 29a under the third array pattern (i.e. the first material stack 43a') can be further patterned to form a final array pattern (for example, the final array pattern 290a in FIG. 16) in the array region A2, in accordance with some embodiments of the present disclosure.

Referring back to FIG. 13, a patterned mask layer 46 (for example, a patterned photoresist layer) is formed over the second material stack 43b' and the nitrogen-containing layer 32 in the peripheral region A2. The patterned mask layer 46 covers the second material stack 43b' and fills the openings of the second material stack 43b' in the peripheral region A2. Also, the patterned mask layer 46 exposes the third array pattern (i.e. the first material stack 43a') in the array region A1. In one embodiment, the patterned mask layer 46 further covers a portion of the third array pattern that is in the array region A1 and adjacent to the peripheral region A2 (as shown in FIG. 13). However, the present disclosure is not limited to the patterned mask layer 46 exemplified in FIG. 13. Whether the patterned mask layer 46 covers a portion of the third array pattern (e.g. the portion in the array region A1 and adjacent to the peripheral region A2) can be determined according to the target pattern to be formed at the boundary between the array region A1 and the peripheral region A2 in the application.

Figure 14:
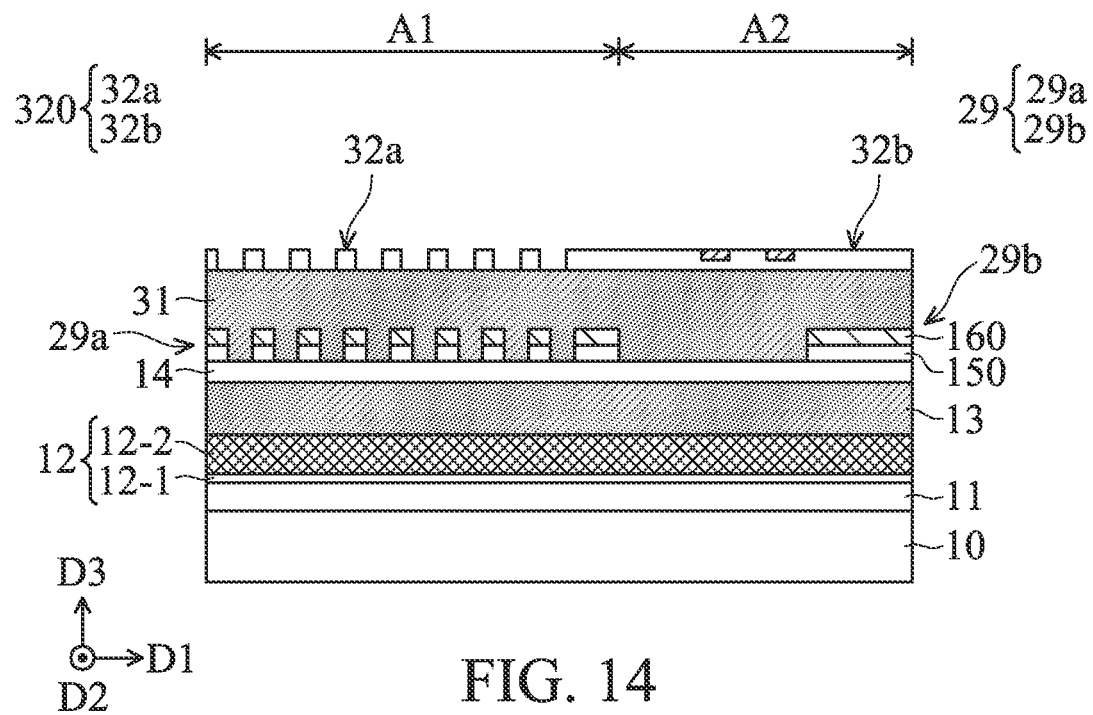

Next, referring to FIG. 14, the portions of the material layer that are exposed through the third array pattern (i.e. the first material stack 43a') and the patterned mask layer 46 are removed by using the third array pattern (i.e. the first material stack 43a') and the patterned mask layer 46 as a mask. In one example, an etching step is performed on the exposed portions of the nitrogen-containing layer 32 until the carbon-containing layer 31 is exposed. The remaining nitrogen-containing layer 32 can be referred as a nitride layer 320. In some embodiments, the stack of patterned material layers 43' (including the first material stack 43a' and the second material stack 43b') and the patterned mask layer 46 are then removed by one or more steps including an ashing process, an etching process, and the like. In this example, after the patterned mask layer 46 is removed, the stack of patterned material layers 43' is removed to leave the nitride layer 320. As shown in FIG. 14, the nitride layer 320 includes a first nitride pattern 32a in the array region A1 and a second nitride pattern 32b in the peripheral region A2, in accordance with some embodiments of the present disclosure.

Figure 15:
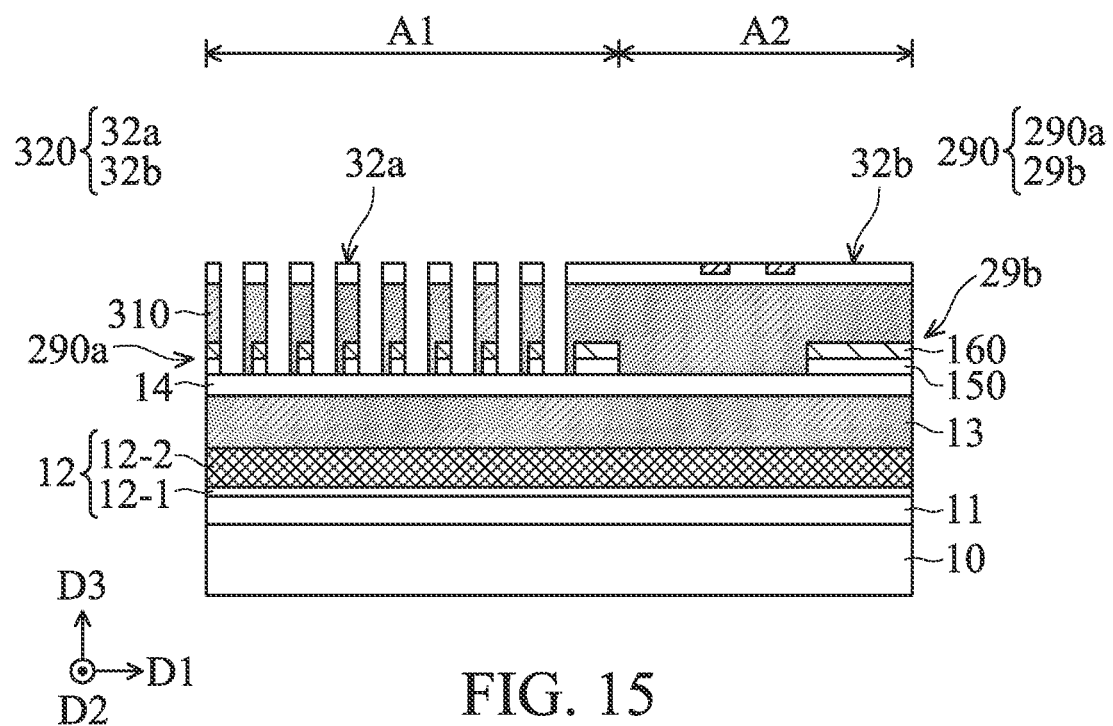

Next, referring to FIG. 15, the portions of the carbon-containing layer 31 and the polysilicon pattern layer 29 that are not covered by the nitride layer 320 are removed by using the nitride layer 320 as a mask, thereby forming the carbon-containing layer 310 and the polysilicon pattern layer 290. In one embodiment, a dry etching process is performed to remove the portions of the carbon-containing layer 31 that are not covered by the first nitride pattern 32a, and further remove the corresponding portions of the second array pattern 29a. As shown in FIG. 15, after etching, the nitride layer 320, the carbon-containing layer 310 and the final array pattern 290a are formed, in accordance with some embodiments of the present disclosure. In this exemplified step, the dielectric layer 14 functions as an etch stop layer.

Figure 16A:
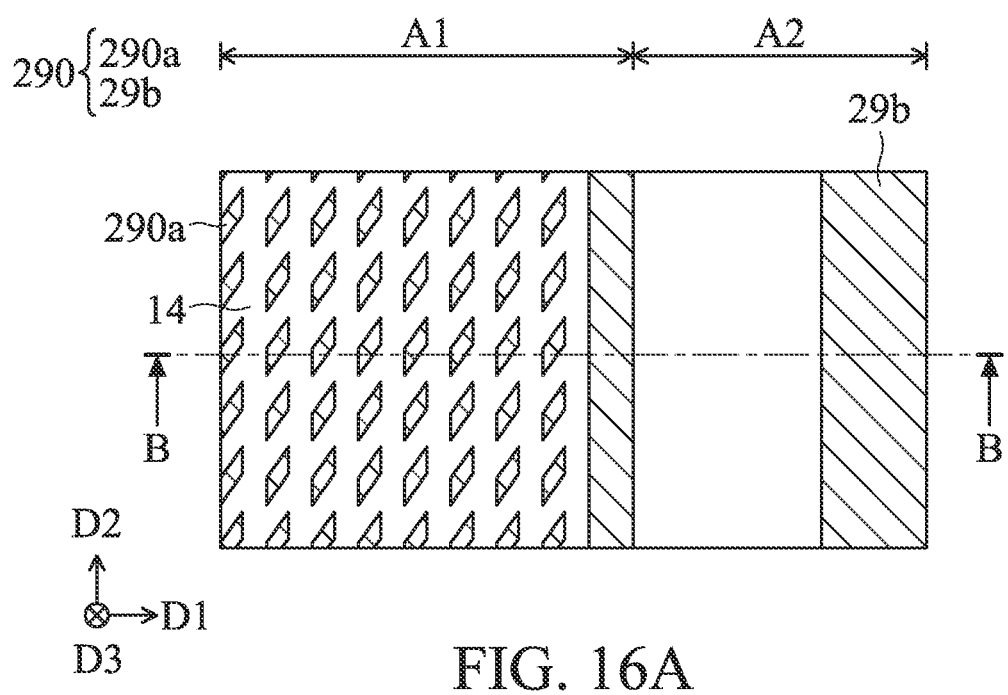
Figure 16B:
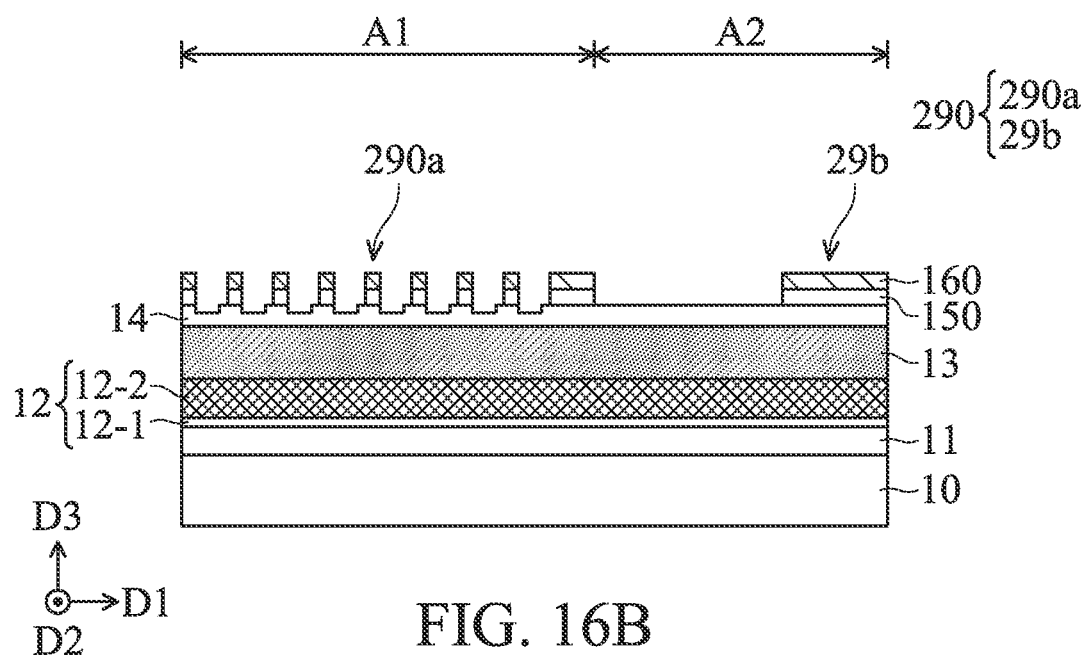

Next, referring to FIG. 16A and FIG. 16B, the nitride layer 320 and the carbon-containing layer 310 are then removed by one or more steps including an ashing process, an etching process, and the like. After the nitride layer 320 and the carbon-containing layer 310 are removed, the polysilicon pattern layer 290 is exposed above the substrate 10. In one embodiment, parts of the dielectric layer 14 may also be removed in this removing step. As shown in FIG. 16A and FIG. 16B, the polysilicon pattern layer 290 includes a final array pattern 290a and a second peripheral pattern (i.e. a final peripheral pattern) 29b, in accordance with some embodiments of the present disclosure. It should be noted that the embodiment of the present disclosure is able to define a high-density target array pattern by implementing the two-stage lithography process illustrated in FIG. 1 to FIG. 3 and FIG. 4 to FIG. 6 and a SADP process illustrated in FIG. 7 to FIG. 15. That is, only one SADP process is required in the method for forming the high-density target array pattern, in accordance with the embodiments of the present disclosure. Therefore, the method of the embodiments only needs to use the high-end immersion lithography technology once for implementing the SADP process, and the manufacturing cost can be greatly reduced.

Figure 17:
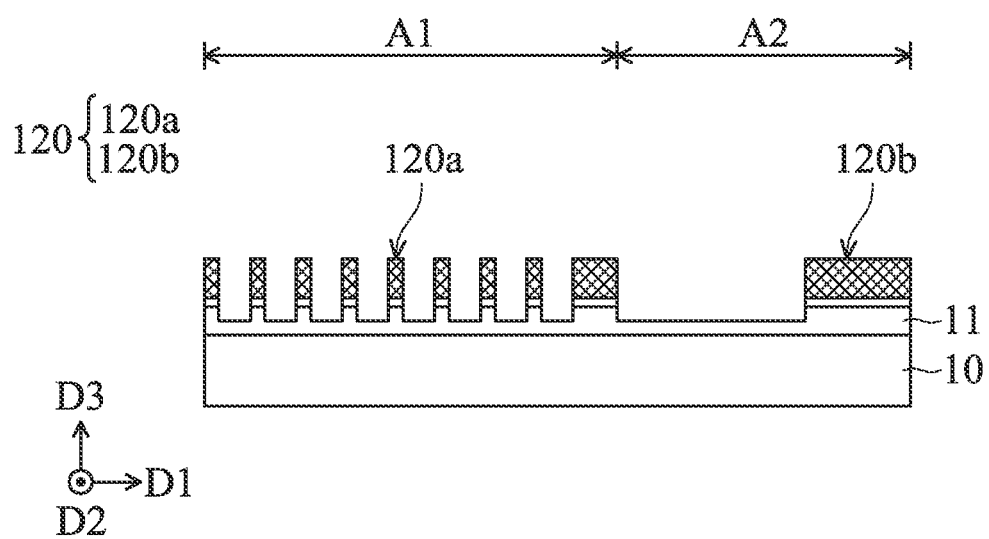

Next, referring to FIG. 17, an etching process can be used to transfer the pattern of the polysilicon pattern layer 290 to the target material layer 12. In this example, the material layers under the polysilicon pattern layer 290, including the dielectric layer 14, the carbide layer 13, the target material layer 12 and the cap layer 11, are etched by using the polysilicon pattern layer 290 as a mask. After etching, the patterns of the final array pattern 290a and the second peripheral pattern 29b of the polysilicon pattern layer 290 are transferred to the target material layer 12. The target material layer 12 is etched to form a target material layer 120. In some embodiments, the target material layer 120a includes a target array pattern 120a formed in the array region A1 and a target peripheral pattern 120b formed in the peripheral region A2. In an application example of a DRAM device, the target array pattern 120a may correspond to the pattern of capacitor contact pads.

According to the method of manufacturing a semiconductor structure in the embodiment of the present disclosure, a two-stage lithography process (e.g. as illustrated in FIG. 1 to FIG. 3 and FIG. 4 to FIG. 6) is performed to simultaneously define a final peripheral pattern in the peripheral region A2 (e.g. the second peripheral pattern 29b in FIG. 6A and FIG. 6B) and a linear pattern extending along the first direction in the array region A1 (e.g. the second array pattern 29a in FIG. 6A and FIG. 6B). Next, a SADP process (e.g. as illustrated in FIG. 7 to FIG. 15) is performed to define a linear pattern (e.g. the third array pattern 43a' in FIG. 13) extending in the second direction in the array region A1. Then, the linear pattern that extends in the first direction is etched by using the linear pattern that extends in the second direction to obtain a final array pattern in the array region A1. Finally, the final array pattern and the final peripheral pattern are simultaneously transferred to the target material layer, in accordance with some embodiments of the present disclosure. Thus, a target array pattern and a target peripheral pattern can be formed in the array region A1 and the peripheral region A2, respectively.

According to the aforementioned embodiments, a pattern in the array region A1 that extends in the first direction can be simultaneously defined when the peripheral pattern in the peripheral region A2 is obtained. Compared with the traditional process in which the array pattern and the peripheral pattern are separately manufactured, the method of manufacturing the semiconductor structure proposed in the embodiment of the present disclosure can simplify the manufacturing steps and greatly reduce the manufacturing cost. In addition, since the present disclosure requires only one SADP process to produce the high-density array pattern, only one high-end immersion lithography technology is required. Compared with the traditional process that requires multiple (for example, more than four times) complicated and expensive SADP processes to produce the array patterns having the same pattern density, the method provided in the embodiment of the present disclosure can greatly reduce the manufacturing cost.

While the disclosure has been described by way of example and in terms of the preferred embodiments, it should be understood that the disclosure is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A method of manufacturing a semiconductor structure, comprising:
    forming a first stack of material layers over a substrate having an array region and a periphery region, wherein the first stack of material layers covers the array region and the periphery region, and the first stack of material layers comprises a first pattern transfer layer and a second pattern transfer layer;
    forming a first patterned mask layer over the first stack of material layers in the array region and the periphery region, wherein the first patterned mask layer exposes a portion of a top surface of the first stack of material layers;
    removing a portion of the first stack of material layers by using the first patterned mask layer as a mask, so as to transfer a pattern of the first patterned mask layer to the first stack of material layers, thereby forming a first array pattern in the array region and a first periphery pattern in the periphery region;
    providing a second patterned mask layer above the first array pattern in the array region and the first periphery pattern in the periphery region, wherein an extension direction of a pattern of the second patterned mask layer is the same as an extension direction of the pattern of the first patterned mask layer, and the pattern of the second patterned mask layer is misaligned and in parallel with the pattern of the first patterned mask layer;
    transferring the pattern of the second patterned mask layer downwards by using the second patterned mask layer as a mask, so as to form a first sacrificial pattern in the array region and a second sacrificial pattern in the periphery region; and transferring the first array pattern and the first sacrificial pattern to form a second array pattern in the array region, and simultaneously transferring the first periphery pattern and the second sacrificial pattern to form a second periphery pattern, in the periphery region.

2. The method of manufacturing the semiconductor structure as claimed in claim 1, wherein a first dielectric layer is disposed between the substrate and the first pattern transfer layer, and the second array pattern and the second periphery pattern are formed over the first dielectric layer.

3. The method of manufacturing the semiconductor structure as claimed in claim 2, wherein a second dielectric layer is disposed between the second pattern transfer layer and the first pattern transfer layer, and wherein the first array pattern, the first periphery pattern, the first sacrificial pattern and the second sacrificial pattern are formed over the second dielectric layer.

4. The method of manufacturing the semiconductor structure as claimed in claim 1, wherein after the first array pattern and the first periphery pattern are formed, the method further comprises:

depositing a carbon-containing layer over the first array pattern and the first periphery pattern to blanketly cover the first array pattern and the first periphery pattern; and forming an anti-reflective layer over the carbon-containing layer, wherein the second patterned mask layer is formed over the anti-reflective layer, wherein the pattern of the second patterned mask layer is transferred to the anti-reflective layer and the carbon-containing layer by using the second patterned mask layer as the mask, so as to form the first sacrificial pattern and the second sacrificial pattern.

5. The method of manufacturing the semiconductor structure as claimed in claim 1, further comprising:

forming a second stack of material layers over the second array pattern and the second periphery pattern;

forming a third patterned mask layer over the second stack of material layers in the array region and the periphery region; and performing a self-aligned double patterning process according to a pattern of the third patterned mask layer to form a stack of patterned material layers, wherein the stack of patterned material layers includes a third array pattern in the array region.

6. The method of manufacturing the semiconductor structure as claimed in claim 5, wherein forming the second stack of material layers comprises:

depositing a carbon-containing layer over the second array pattern and the second periphery pattern;

depositing a nitride layer on the carbon-containing layer;

depositing a silicon oxide layer on the nitride layer; and forming a third pattern transfer layer on the silicon oxide layer, wherein the third patterned mask layer is formed over the third pattern transfer layer.

7. The method of manufacturing the semiconductor structure as claimed in claim 6, wherein the self-aligned double patterning process comprises:

transferring the pattern of the third patterned mask layer to the third pattern transfer layer to form a core pattern layer, wherein the core pattern layer comprises a first core pattern in the array region and a second core pattern in the periphery region;

depositing a spacer material layer over the silicon oxide layer and the core pattern layer, wherein the spacer material layer is conformally formed on and covers the core pattern layer;

forming a planarization layer to completely cover the spacer material layer;

removing a portion of the planarization layer and a portion of the spacer material layer until a top surface of the core pattern layer is exposed, wherein remaining portions of the planarization layer fill spaces between remaining portions of the spacer material layer;

removing the remaining portions of the spacer material layer to expose the silicon oxide layer;

removing portions of the spacer material layer and the silicon oxide layer that are uncovered by the remaining portions of the planarization layer and the core pattern layer, by using the remaining portions of the planarization layer and the core pattern layer as a mask, until the nitride layer is exposed; and removing the carbon-containing layer and the remaining portions of the planarization layer to form the stack of patterned material layers.

8. The method of manufacturing the semiconductor structure as claimed in claim 5, wherein an included angle between an extension direction of the pattern of the third patterned mask layer and a first direction is less than 90 degrees, or the pattern of the third patterned mask layer extends in the first direction.

9. The method of manufacturing the semiconductor structure as claimed in claim 5, further comprising:

forming a fourth patterned mask layer to cover the periphery region and expose the third array pattern in the array region; and removing portions of an underlying material layer that are exposed by the fourth patterned mask layer and the third array pattern, and further removing corresponding portions of the second array pattern, so as to transfer the second array pattern into a final array pattern.

10. The method of manufacturing the semiconductor structure as claimed in claim 9, wherein a target material layer is formed between the substrate and the first stack of material layers, and the target material layer covers the array region and the peripheral region.

11. The method of manufacturing the semiconductor structure as claimed in claim 10, further comprising:

simultaneously transferring the final array pattern in the array region and the second peripheral pattern in the peripheral region to the target material layer, so as to form a target array pattern in the array region and a target peripheral pattern in the peripheral region.

12. The method of manufacturing the semiconductor structure as claimed in claim 11, wherein the target array pattern is a pattern of capacitive contact pads that are formed in the array region of a dynamic random access memory (DRAM) device.

13. The method of manufacturing the semiconductor structure as claimed in claim 10, further comprising:

a carbon-containing layer formed over the target material layer and disposed between the substrate and the first stack of material layers, wherein the carbon-containing layer covers the array region and the peripheral region, wherein the third array pattern is formed over the carbon-containing layer, wherein the second array pattern and the second peripheral pattern are formed in the carbon-containing layer.

14. The method of manufacturing the semiconductor structure as claimed in claim 13, further comprising:

a first dielectric layer formed over the target material layer, wherein the first dielectric layer is formed on the carbon-containing layer, wherein after the second array pattern is transferred into the target array pattern, the final array pattern in the array region and the second peripheral pattern in the peripheral region are formed on the first dielectric layer.

\* \* \* \* \*